(12) United States Patent
Kim (10) Patent No.: US 9,735,388 B2
(45) Date of Patent: Aug. 15, 2017

(54) NARROW BEZEL LARGE AREA ORGANIC LIGHT EMITTING DIODE DISPLAY

(71) Applicant: LG Display Co., Ltd., Seoul (KR)

(72) Inventor: Jungchul Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 14/939,088

(22) Filed: Nov. 12, 2015

(65) Prior Publication Data

US 2016/0141545 A1 May 19, 2016

(30) Foreign Application Priority Data

Nov. 14, 2014 (KR) .................. 10-2014-0159172

(51) Int. Cl.
*H01L 51/52* (2006.01)
*H01L 27/32* (2006.01)
*G09G 3/3225* (2016.01)

(52) U.S. Cl.
CPC ....... *H01L 51/5228* (2013.01); *G09G 3/3225* (2013.01); *H01L 27/3276* (2013.01); *H01L 51/5253* (2013.01)

(58) Field of Classification Search
CPC . H01L 51/52; H01L 51/5253; H01L 51/5228; H01L 27/3276; H01L 27/3258; G09G 3/3225
See application file for complete search history.

(56) References Cited

U.S. PATENT DOCUMENTS

| 2002/0104995 | A1 | 8/2002 | Yamazaki et al. |
| 2006/0060850 | A1 | 3/2006 | Kwak et al. |
| 2014/0159043 | A1* | 6/2014 | Sakariya ............... H01L 27/124 257/59 |
| 2015/0084003 | A1* | 3/2015 | Kim ..................... H01L 27/3262 257/40 |
| 2015/0243724 | A1* | 8/2015 | Cho ..................... H01L 29/7869 257/43 |

FOREIGN PATENT DOCUMENTS

| EP | 1575090 A2 | 9/2005 |
| EP | 1748680 A2 | 1/2007 |
| JP | 2007-156058 A | 6/2007 |

OTHER PUBLICATIONS

Extended European Search Report for Application No. 15194703.3, dated Mar. 22, 2016.

* cited by examiner

*Primary Examiner* — Phuc Dang
(74) *Attorney, Agent, or Firm* — Morgan, Lewis & Bockius LLP (57) ABSTRACT

The present disclosure relates to a narrow bezel large area organic light emitting diode display. An organic light emitting diode display includes a substrate having a display area and a non-display area; a gate driver disposed in the non-display area; a ground line overlapping on the gate driver with a passivation layer; an anode electrode disposed in the display area; an organic light emission layer disposed in the display area and stacked on the anode electrode; and a cathode electrode stacked on the organic light emission layer and contacting the ground line.

4 Claims, 8 Drawing Sheets

FIG. 1

Related Art

FIG. 2

Related Art

NARROW BEZEL LARGE AREA ORGANIC LIGHT EMITTING DIODE DISPLAY

This application claims the benefit of Korea Patent Application No. 10-2014-0159172 filed on Nov. 14, 2014, which is incorporated herein by reference for all purposes as if fully set forth herein.

BACKGROUND OF THE INVENTION

Field of the Invention

The present invention relates to an organic light emitting diode display, and more particularly, to a narrow bezel organic light emitting diode display having an auxiliary cathode electrode.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

Figure 1:
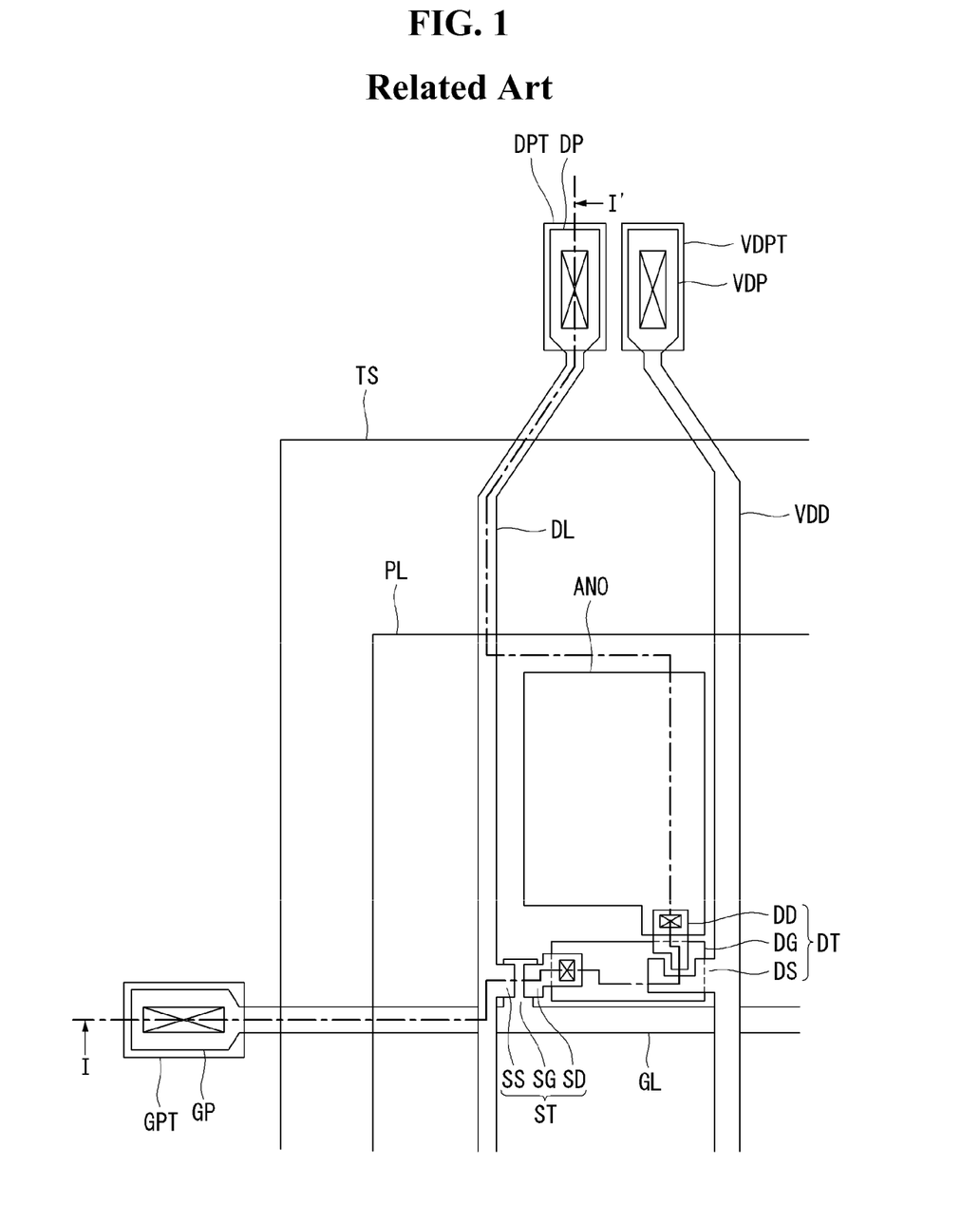
FIG. 1 is a plane view illustrating the structure of the organic light emitting diode display having the active switching elements such as the thin film transistors according to the related art.
Figure 2:
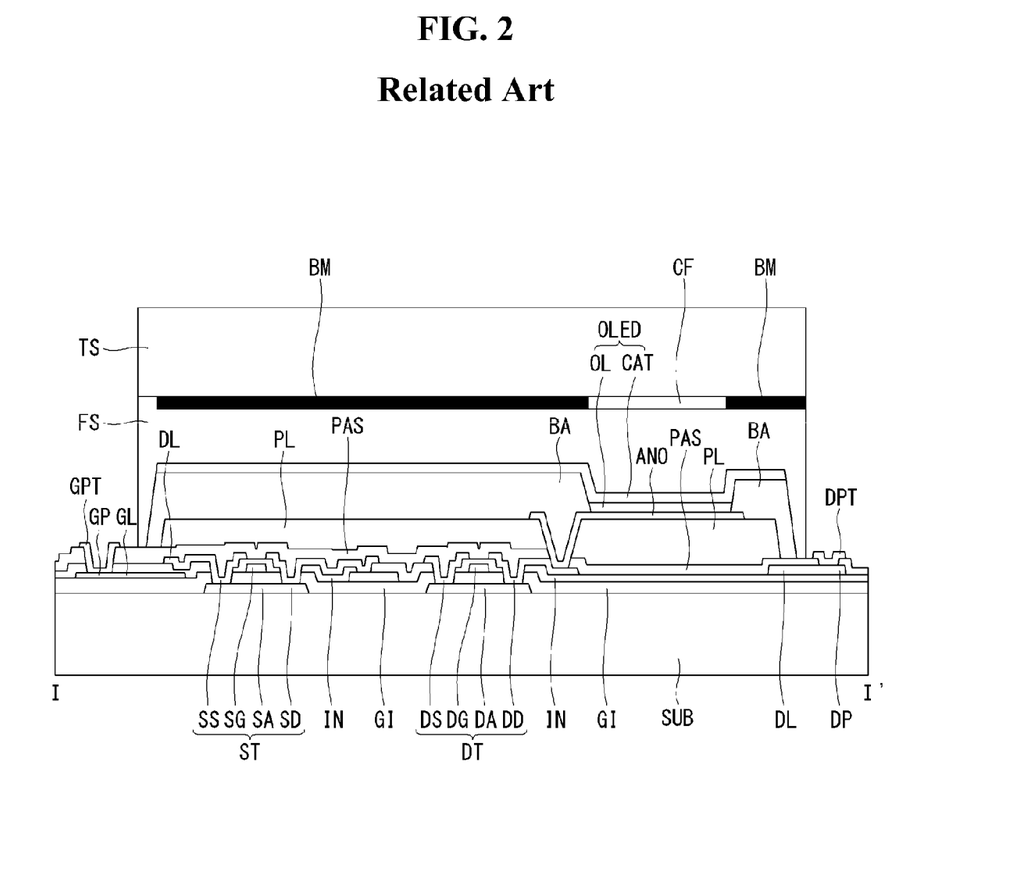
FIG. 2 is a cross sectional view illustrating the structure of the organic light emitting diode display along to the cutting line of I-I' in FIG. 1 according to the related art.

FIG. 1 is a plane view illustrating the structure of the organic light emitting diode display having the active switching elements such as the thin film transistors according to the related art. FIG. 2 is a cross sectional view illustrating the structure of the organic light emitting diode display along to the cutting line of I-I' in FIG. 1 according to the related art.

Referring to FIGS. 1 and 2, the organic light emitting diode display comprises a thin film transistor (or 'TFT') substrate having the thin film transistors ST and DT and an organic light emitting diode OD connected to and driven by the thin film transistors ST and DT, and a cap ENC joining and facing the TFT substrate with an organic adhesive POLY therebetween. The TFT substrate includes a switching thin film transistor ST, a driving thin film transistor DT connected to the switching thin film transistor ST, and an organic light emitting diode OD connected to the driving thin film transistor DT.

On a transparent substrate SUB, the switching thin film transistor ST is formed where a gate line GL and a data line DL are crossing each other. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OD.

As one example, FIG. 2 shows the thin film transistor of top gate structure. In this case, the semiconductor channel layers SA and DA of the switching thin film transistor ST and the driving thin film transistor DT are firstly formed on the substrate SUB and the gate insulating layer GI covers them and then the gate electrodes SG and DG are formed thereon by overlapping with the center portion of the semiconductor channel layers SA and DA. After that, at both sides of the semiconductor channel layers SA and DA, the source electrodes SS and DS and the drain electrodes SD and DD are connected thereto through contact holes penetrating an insulating layer IN. The source electrodes SS and DS and the drain electrodes SD and DD are formed on the insulating layer IN.

In addition, at the outer area surrounding the display area where the pixel area is disposed, a gate pad GP formed at one end of the gate line GL, a data pad DP formed at one end of the data line DL, and a driving current pad VDP formed at one end of the driving current line VDD are arrayed. A passivation layer PAS is disposed to cover the upper whole surface of the substrate SUB having the switching and the driving thin film transistors ST and DT. After that, formed are the contact holes exposing the gate pad GP, the data pad DP, the driving current pad VDP and the drain electrode DD of the driving thin film transistor DD. Over the display area within the substrate SUB, a planar layer PL is coated. The planar layer PL makes the roughness of the upper surface of the substrate SUB in much smoother condition, for coating the organic materials composing the organic light emitting diode on the smooth and planar surface condition of the substrate SUB.

On the planar layer PL, the anode electrode ANO is formed to connect the drain electrode DD of the driving thin film transistor DT through one of the contact holes. On the other hands, at the outer area of the display area not having the planar layer PL, formed are a gate pad electrode GPT, a data pad electrode DPT and a driving current electrode VDPT connected to the gate pad GP, the data pad DP and the driving current pad VDP, respectively, exposed through the contact holes. On the substrate SUB, a bank BA is formed covering the display area, excepting the pixel area.

On the bank BA and the exposed anode electrode ANO by the bank BA, an organic light emission layer OL is stacked. Then, on the organic light emission layer OL, a cathode electrode CAT is deposited. As a result, an organic light emitting diode OLED having the stacked structure of the anode electrode ANO, the organic light emission layer OL and the cathode electrode CAT is completed.

A cap TS is joining the thin film transistor substrate having above mentioned structure with the constant gap therebetween. In that case, it is preferable that the thin film transistor substrate and the cap TS are completely sealed by having an organic adhesive FS between them. The organic adhesive FS prevents moisture and gases from intruding into the inner space of the thin film transistor substrate. The gate pad electrode GPT and the data pad electrode DPT exposing to the exterior of the cap ENC may be connected to external devices via the various connecting means.

In addition, the cap TS includes a black matrix BM disposed at the non-display area and a color filter CF disposed at the display area, on the inner side of the cap TS. Especially, in the case that the organic light emission layer OL generates the white light, the full color including red (R)-green(G)-blue(B) colors can be represented by using the color filter CF.

For the organic light emitting diode display having such a structure mentioned above, the cathode electrode CAT supplied with the reference voltage is deposited over the whole surface of the substrate for the display panel. When the cathode electrode CAT is made of metal material having relatively lower resistance, there is no problem. When the cathode electrode CAT is made of a transparent conductive material for ensuring enough transmittivity, the surface resistance of the cathode electrode CAT is high so this may cause degradation of the video quality.

For examples, when the cathode electrode CAT includes a transparent conductive material such as the indium-tin-oxide or the indium-zinc-oxide having higher resistivity (or, specific resistance) than metal materials, the surface resistance of the cathode electrode CAT is relatively high. As a result, the cathode electrode CAT may not have even voltage distribution over the whole surface of the display panel. This may cause the unevenness of the brightness or luminance of the display panel. Especially, as the area of the organic light emitting diode display is getting larger, the unevenness of the luminance or lightness may be severely caused.

SUMMARY OF THE INVENTION

Accordingly, the present invention is directed to an organic light emitting diode display that substantially obviates one or more of the problems due to limitations and disadvantages of the related art.

An object of the present invention is to provide a large area organic light emitting diode display having an auxiliary cathode electrode for lowering the surface resistance of the cathode electrode.

Another object of the present invention is to provide a large area organic light emitting diode display having a narrow bezel structure in which a ground line disposed in the non-display area is overlapped with the gate driver elements.

Still another object of the present invention is to provide a large area organic light emitting diode display having a narrow bezel structure in which the ground line disposed at the non-display area surrounding the outer circumference of the display is directly connected to the cathode electrode and/or the auxiliary cathode electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode display comprises a substrate including a display area and a non-display area; a gate driver disposed in the non-display area; a ground line overlapping on the gate driver with a passivation layer; an anode electrode disposed in the display area; an organic light emission layer disposed in the display area and stacked on the anode electrode; and a cathode electrode stacked on the organic light emission layer and contacting the ground line.

In one embodiment, the organic light emitting diode display further comprises: a thin film transistor disposed in the display area and contacting the anode electrode; and an auxiliary cathode electrode including the same material with the anode electrode, separated from the anode electrode, and contacting the ground line.

In one embodiment, the organic light emitting diode display further comprises: a planar layer disposed on the ground line and the thin film transistor, and exposing some portions of the ground line and the thin film transistor, wherein the anode electrode and the auxiliary cathode electrode are disposed on the planar layer, wherein the auxiliary cathode electrode contacts the ground line exposed from the planar layer, and wherein the cathode electrode contacts the auxiliary cathode electrode and the ground line.

In one embodiment, the organic light emitting diode display further comprises: a thin film transistor disposed in the display area and contacting the anode electrode; a first storage electrode overlapping with the thin film transistor on a first passivation layer; and a second storage electrode overlapping with the first storage electrode with a second passivation layer, wherein the ground line is disposed on a same layer and includes a same material with any one of the first storage electrode and the second storage electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

First Embodiment

Figure 3:
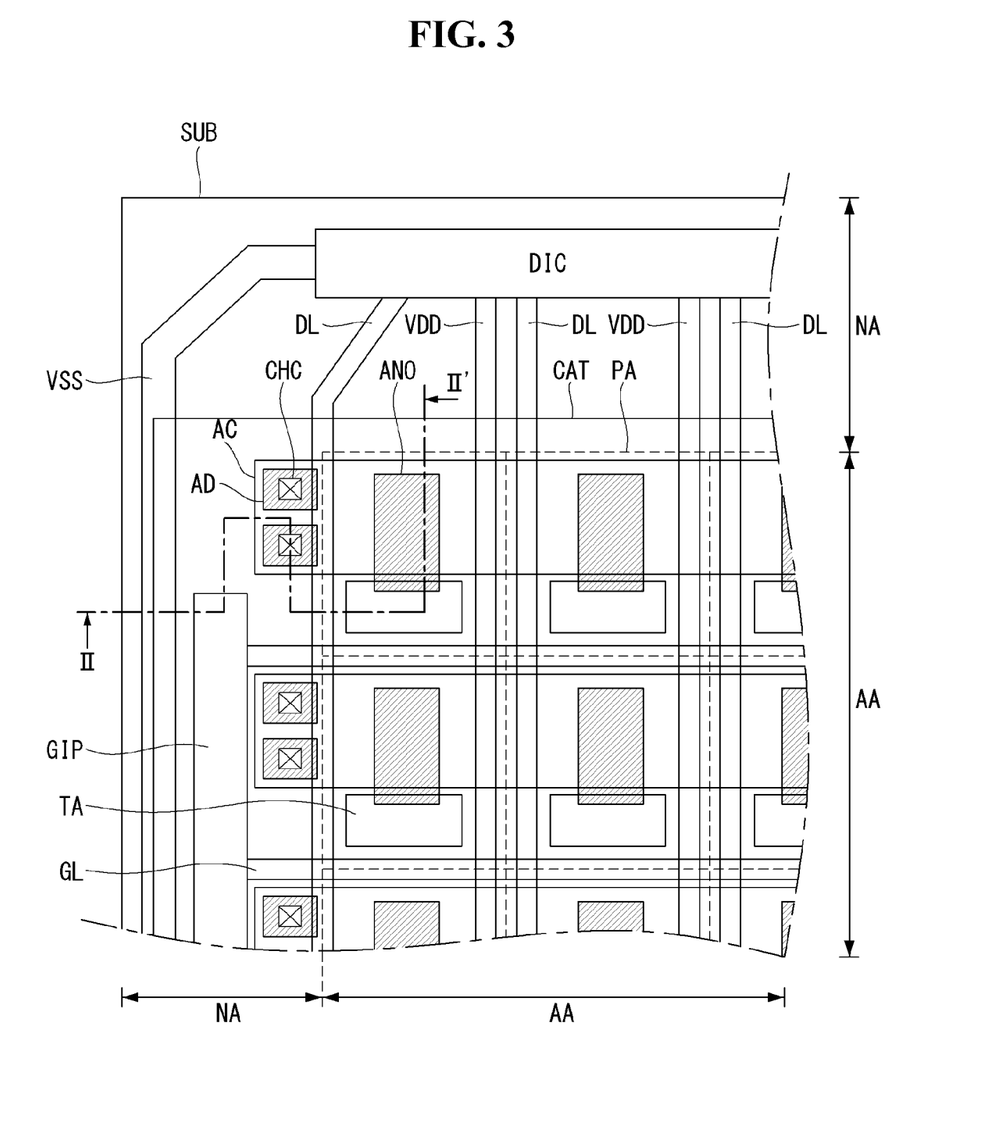
FIG. 3 is an enlarged plane view illustrating a structure of an organic light emitting diode display according to a first example embodiment of the present disclosure.
Figure 4:
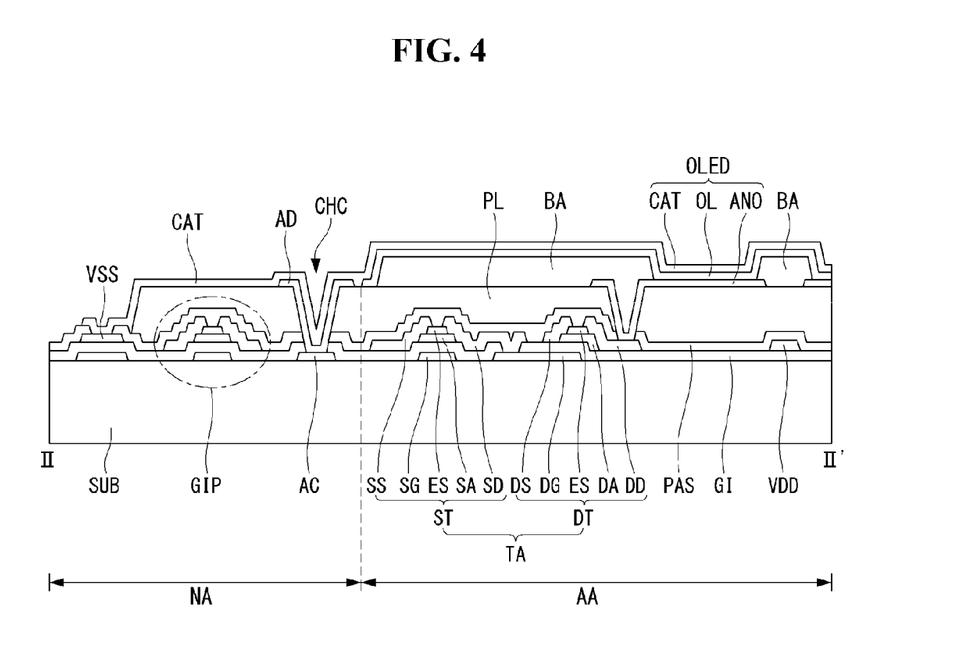
FIG. 4 is a cross sectional view illustrating a structure of the organic light emitting diode display along to the cutting line of II-II' in FIG. 3 according to the first embodiment of the present disclosure.

FIG. 3 is an enlarged plane view illustrating a structure of an organic light emitting diode display according to a first example embodiment of the present disclosure. FIG. 4 is a cross sectional view illustrating a structure of the organic light emitting diode display along to the cutting line of II-II' in FIG. 3 according to the first embodiment of the present disclosure.

Referring to FIGS. 3 and 4, we will explain about the first embodiment of the present disclosure. One of the main features of the present disclosure is at the structure of the auxiliary (or, assistance) cathode electrode for lowering the resistance of the cathode electrode. Therefore, we will not explain in detail about the thin film transistor and/or the organic light emitting diode having the similar structure of the related art.

At first, referring to FIG. 3, we will explain about the plane structure of the organic light emitting diode display according to the first embodiment in detail. An organic light emitting diode display according to the first embodiment of the present disclosure comprises a substrate SUB including a display area AA for representing the video information and a non-display area NA having various elements for driving the elements in the display area AA. In the display area AA, a plurality of pixel areas PA disposed in a matrix manner are defined. In FIG. 3, the pixel area PA is illustrated as the dotted line.

For example, the pixel areas PA can be defined as an N (row)×M (column) matrix. However, the disposed pattern is not restricted this manner, but it has various type. Each of the pixel area PA has the same size or the different size. With one unit pixel having three sub pixels including red (R), green (G) and blue (B) sub pixels, the unit pixels are regularly disposed. Explaining with the simplest structure, the pixel area PA can be defined by the crossing structure of a plurality of gate lines GL running to horizontal direction and a plurality of data lines DL running to vertical direction.

In the non-display area NA defined as the circumstance area surrounding the pixel area PA, a data driving integrated circuit DIC for supplying the video data to the data line DL and a gate driving integrated circuit GIP for supplying the scan signal to the gate line GL are disposed. For that case of higher resolution display panel than VGA panel in which more data lines DL and more driving current lines VDD are required, the data driving integrated circuit DIC may be externally installed from the substrate SUB, and data contact pads may be disposed on the substrate SUB instead of the data driving integrated circuit DIC.

In order to simply show the structure of the display, the gate driving integrated circuit GIP is formed on one side portion of the substrate SUB directly. The ground line Vss for supplying the ground voltage may be disposed at the outermost side of the substrate SUB. The ground line Vss is disposed as to receive the ground voltage from external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is formed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping with the anode electrode ANO.

The anode electrode ANO is formed as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL so as to cover whole surface of the display area AA having the pixel areas PA.

The cathode electrode CAT may go over the gate driving integrated circuit GIP and contact the ground line Vss disposed at the outer side. So, the ground voltage can be supplied to the cathode electrode CAT through the ground line Vss. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

The cathode electrode CAT may be made of a transparent conductive material such as the Indium-Tin-Oxide or the Indium-Zinc-Oxide. Theses transparent conductive materials have relatively high specific resistance than the metal materials. For the top emission type organic light emitting diode display, the anode electrode ANO may be made of the metal material having low resistance and high reflection, so there is no resistance problem. On the contrary, the cathode electrode CAT is made of the transparent conductive material for ensuring transmittivity of the light generated by the organic light emission layer OL.

Especially, for the large area top emission type, in order to lower the resistance of the cathode electrode CAT, the cathode electrode CAT would be made of the metal material having lower resistance such as silver, Ag. In that case, considering the light transmittivity of the cathode electrode CAT, it is preferable that the cathode electrode CAT is formed with thin thickness as possible. Even though the cathode electrode CAT is made of the silver having lower resistance, when its thickness is getting thinner and thinner and it covers larger area, the surface resistance of the large area sheet silver layer would be higher. Then, the ground voltage may not be maintained uniformly over the whole surface of the substrate SUB. For example, the difference of the ground voltages between the inlet side and the outlet side (the farthest side from the inlet side) of the ground voltage through the substrate SUB would be large so that the brightness of the display panel would not be uniformly distributed.

In order to prevent this problem, the present disclosure suggests a large area organic light emitting diode display including an auxiliary cathode electrode AC made of metal material having lower specific resistance. In the first embodiment of the present disclosure, we will explain about the display panel in which the auxiliary cathode electrode AC is formed at the same layer with the gate line GL. In this case, the auxiliary cathode electrode AC may have a plurality of segments disposed parallel with the gate line GL. The auxiliary cathode electrode AC may be contacted the cathode electrode CAT through a cathode contact hole CHC.

In order to lower the surface resistance effectively, it is preferable that the number of the cathode contact hole CHC would be large as possible. However, too much number of the cathode contact hole CHC may not be good, because the contact resistance may be increased. Therefore, it is important to select proper number of the cathode contact hole CHC. In FIG. 3 showing the first embodiment of the present disclosure, the cathode contact holes CHC are disposed at some portions of the outside of the display area AA. If required, a plurality of pixel area cathode contact hole may be further included in each pixel area AA.

For the case of the top emission type, the lights generated from the organic light emission layer OL radiates toward the cathode electrode CAT, so that the auxiliary cathode electrode AC may be formed as having a wide strip type as being overlapped with but not contact the anode electrode ANO thereunder. For the case of the bottom emission type, the auxiliary cathode electrode AC may be disposed as not being overlapped with the emission area but being parallel with the gate line GL and/or data line DL.

With the condition in which the auxiliary cathode electrode AC is exposed through the cathode contact hole CHC, a bank BN and the organic light emission layer OL are formed and/or deposited. During these processes, the exposed surface of the auxiliary cathode electrode AC may be damaged. Especially, when the auxiliary cathode electrode AC has the copper (Cu) material in order to ensure lower resistance, the surface contact property of the auxiliary cathode electrode AC may be degraded. As the result, the auxiliary cathode electrode AC may be peeled off, or the contact with the cathode electrode CAT may not be good and normal condition.

In order to prevent these problem, in the first embodiment of the present disclosure, the large area organic light emitting diode display further comprises a protective electrode AD covering the auxiliary cathode electrode AC exposed through the cathode contact hole CHC. Considering the manufacturing process, the protective electrode AD may be formed at the same layer and made of the same material with the anode electrode ANO.

Further referring to FIG. 4, we will explain about the cross-sectional structure of the organic light emitting diode display according to the first embodiment of the present disclosure, in detail. Here, in convenience, the thin film transistor has the bottom gate structure. However, the main feature of the first embodiment can be applied to the top gate structure also.

On the substrate SUB, a non-display area NA and a display area AA are defined. The non-display area NA includes the gate driving integrated circuit GIP and the ground line Vss are disposed. The display area AA includes a switching thin film transistor ST, a driving thin film transistor DT and an organic light emitting diode OLED are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is formed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. At the same time, cathode contact holes CHC are formed in the non-display area NA for exposing some area of the auxiliary cathode electrode AC. On the exposed anode electrode ANO, an organic light emission layer OL is deposited. Depositing a transparent conductive material on the bank BA, the cathode electrode CAT is formed. The organic light emitting diode OLED including the anode electrode ANO, the organic light emission layer OL and the cathode electrode CAT is formed.

In addition, auxiliary cathode electrode AC is made of the same metal material used for the gate line GL and the gate electrodes SG and DG of the thin film transistors ST and DT, and at the same layer with the gate line GL and the gate electrodes SG and DG. Especially, in the first embodiment, the auxiliary cathode electrode AC has a line shape parallel with the gate line GL. The auxiliary cathode electrode AC is for lowering the surface resistance of the cathode electrode CAT so that it should be electrically and physically connected to the cathode electrode CAT. Therefore, a plurality of cathode contact holes CHC exposing some portions of the auxiliary cathode electrode AC are formed by penetrating the gate insulating layer GI, the passivation layer PAS and the planar layer PL.

For the case of the top emission type, as the lights generated at the organic light emission layer OL do not radiate to the substrate SUB, the auxiliary cathode electrode AC can be disposed under the anode electrode ANO and it may be overlapped with the anode electrode ANO, further, it may be parallel with the gate line GL. For the cases of the bottom emission type and the both sides emission type, as the lights would radiate to the substrate SUB, the auxiliary cathode electrode AC would be preferably disposed as being parallel with the gate line GL, but not being overlapped with the anode electrode ANO, and not contacting with the gate line GL.

A protective electrode AD is made of the same material with the anode electrode ANO during forming the anode electrode ANO, as covering the cathode contact hole CHC. The protective electrode AD would preferably have an isolated shape not contacting the anode electrode ANO. As the protective electrode AD is for preventing the exposed surface of the auxiliary cathode electrode AC through the cathode contact hole CHC, it would preferably have larger size than the cathode contact hole CHC.

On the substrate SUB having the bank BA, the organic light emission layer OL is deposited. In the case that the organic light emission layer OL may generate the white lights, color filters CF may be further included for representing full color video information. In that case, the organic light emission layer OL would be preferably formed as covering the whole surface of the display area AA. In the first embodiment, the cathode contact hole CHC (for connecting the auxiliary cathode electrode AC to the cathode electrode CAT) and the protective electrode AD are disposed within the non-display area NA. Therefore, the organic light emission layer OL may be not deposited on the protective electrode AD.

On the substrate SUB having the organic light emission layer OL, the cathode electrode CAT is deposited. The cathode electrode CAT is expanded over the gate driving integrated circuit GIP so that it may cover the display area AA and the non-display area NA and contact the ground line Vss disposed at the outer circumstance of the substrate SUB. As the result, the ground (or, reference) voltage can be supplied to the cathode electrode CAT via the ground line Vss.

In addition, the ground line Vss may be formed at the same layer and made of the same material with the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material with the source-drain electrodes SS-SD and DS-DD. In this case, the cathode electrode CAT can be connected to the ground line Vss through the contact hole penetrating the passivation layer PAS over the ground line Vss.

In the first embodiment, the cathode electrode CAT is connected to the auxiliary cathode electrode AC via the cathode contact hole CHC. For more detail, the auxiliary cathode electrode AC contacts the protective electrode AD through the cathode contact hole CHC and the cathode electrode CAT is directly contact the protective electrode AD. For the large area organic light emitting diode display, as the area of the cathode electrode CAT is getting larger, thanks to the auxiliary cathode electrode AC including the low resistance metal material, the ground voltage can be supplied to the cathode electrode CAT with the uniform voltage value over the whole surface of the cathode electrode CAT. Further, thanks to the protective electrode AD, even the case that the auxiliary cathode electrode AC has the copper material, the surface stability of the auxiliary cathode electrode AC exposed through the cathode contact hole CHC can be ensured.

In the above explained first embodiment, the auxiliary cathode electrode AC is included for lowering the surface resistance of the cathode electrode in the case that the cathode electrode has relatively high resistance because the cathode electrode is made of the transparent conductive material such as the indium thin oxide. Further, for the top emission type, the auxiliary cathode electrode can be formed as overlapping with the anode electrode disposed at the emission area, so that the auxiliary cathode electrode can be formed as large as possible.

Second Embodiment

In the second embodiment, we will explain about the organic light emitting diode display having the narrow bezel structure. In this embodiment, we will explain that the top emission type organic light emitting diode display has the narrow bezel structure. However, the features for having the narrow bezel structure according to the present disclosure can be applied to the bottom emission type and/or the both emission type.

Figure 5:
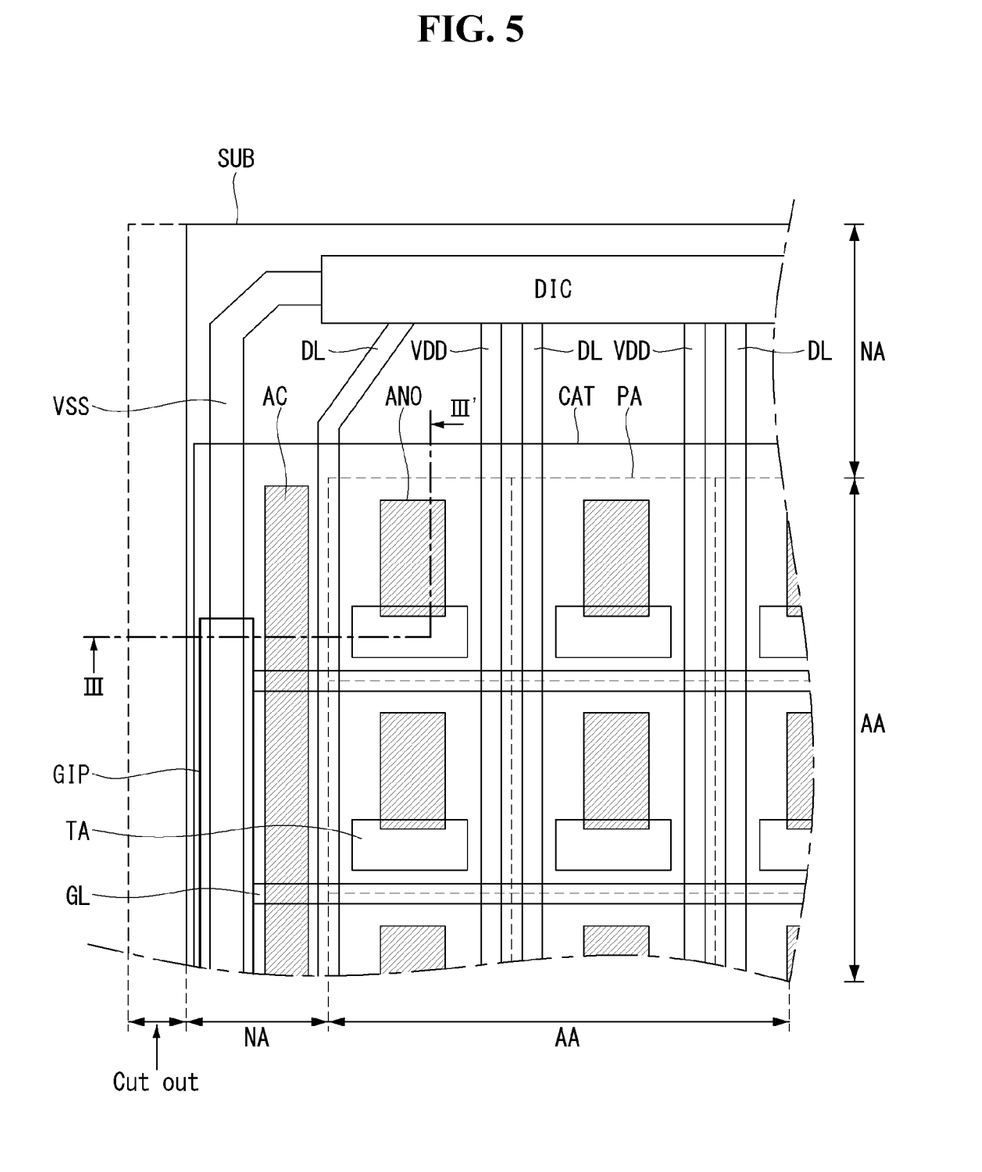
FIG. 5 is an enlarged plane view illustrating a structure of an organic light emitting diode display according to a second example embodiment of the present disclosure.
Figure 6:
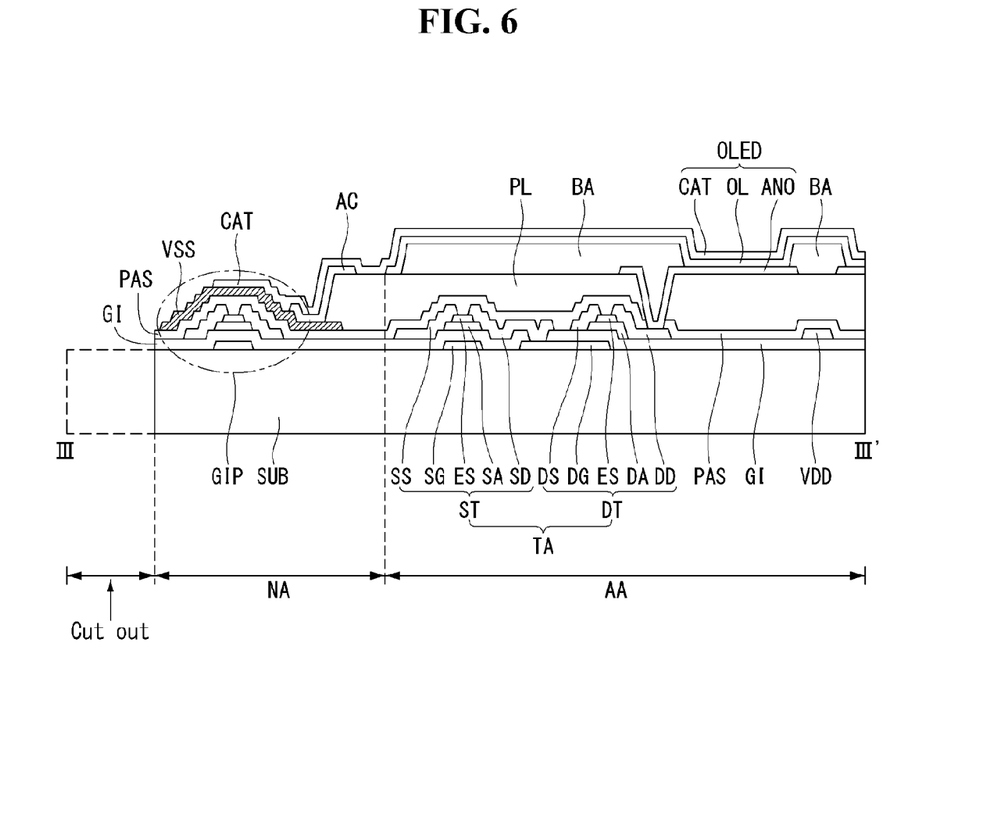
FIG. 6 is a cross sectional view illustrating a structure of the organic light emitting diode display along to the cutting line of III-III' in FIG. 5 according to the second embodiment of the present disclosure.

FIG. 5 is an enlarged plane view illustrating a structure of an organic light emitting diode display according to a second example embodiment of the present disclosure. FIG. 6 is a cross sectional view illustrating a structure of the organic light emitting diode display along to the cutting line of III-III' in FIG. 5 according to the second embodiment of the present disclosure.

Referring to FIG. 5, an organic light emitting diode display according to the second embodiment of the present disclosure comprises a substrate SUB including a display area AA for representing the video information and a non-display area NA having various elements for driving the elements in the display area AA. In the display area AA, a plurality of pixel areas PA disposed in a matrix manner are defined. In FIG. 5, the pixel area PA is illustrated as the dotted line. The pixel areas PA can be defined by the crossing structure of a plurality of the gate lines GL running to horizontal direction and a plurality of the data lines DL and the driving current lines VDD running to vertical direction.

In the non-display area NA defined as the circumstance area surrounding the pixel area PA, a data driving integrated circuit DIC for supplying the video data to the data line DL and a gate driving integrated circuit GIP for supplying the scan signal to the gate line GL are disposed. In order to simply show the structure of the display, the gate driving integrated circuit GIP is formed on one side portion of the substrate SUB directly. Further, the ground line Vss for supplying the ground voltage may be disposed at the outermost side of the substrate SUB. The ground line Vss is disposed as to receive the ground voltage from external device located out of the substrate SUB, and to supply the ground voltage to the data driving integrated circuit DIC and the gate driving integrated circuit GIP.

Especially, in the second embodiment, for the narrow bezel structure, the bezel area is designed as having the minimized size. The bezel area corresponds to the non-display area NA. Therefore, for narrow bezel structure, the non-display area NA should have the minimized width size, as possible. For example, the ground line Vss is connected to the data driving integrated circuit DIC disposed at the upper side of the substrate SUB, and is disposed as overlapping with the gate driving integrated circuit GIP located at the left side and/or the right side of the substrate SUB.

At each pixel area PA, the main elements such as an organic light emitting diode and thin film transistors for driving the organic light emitting diode are disposed. The thin film transistor is formed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping with the anode electrode ANO.

The anode electrode ANO is formed as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL so as to cover whole surface of the display area AA having the pixel areas PA.

The cathode electrode CAT contacts the ground line Vss disposed over the gate driving integrated circuit GIP. So, the ground voltage can be supplied to the cathode electrode CAT through the ground line Vss. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

The cathode electrode CAT may be made of a transparent conductive material such as the Indium-Tin-Oxide or the Indium-Zinc-Oxide. Theses transparent conductive materials have relatively high specific resistance than the metal materials. For the top emission type organic light emitting diode display, the anode electrode ANO may be made of the metal material having low resistance and high reflection, so there is no resistance problem. On the contrary, the cathode electrode CAT is made of the transparent conductive material for ensuring transmittivity of the light generated by the organic light emission layer OL.

Especially, for the large area top emission type, the surface resistance of the cathode electrode would be getting higher as the area is getting larger. Then, the ground voltage may not be maintained uniformly over the whole surface of the substrate SUB. For example, the difference of the ground voltages between the inlet side and the outlet side (the farthest side from the inlet side) of the ground voltage through the substrate SUB would be large so that the brightness of the display panel would not be uniformly distributed.

In order to prevent this problem, the present disclosure suggests a large area organic light emitting diode display including an auxiliary cathode electrode AC made of metal material having lower specific resistance. In the second embodiment of the present disclosure, we will explain about the case of the display panel in which the auxiliary cathode electrode AC is formed at the same layer with the anode electrode ANO. In that case, the auxiliary cathode electrode AC is made of the same material with the anode electrode ANO, but it is separated from the anode electrode ANO with a predetermined distance. As the result, it is preferable that the auxiliary cathode electrode AC and the anode electrode ANO are not connected electrically and physically.

The auxiliary cathode electrode AC can be disposed any place where the anode electrode ANO is disposed, on the substrate SUB. In the drawings, the auxiliary cathode electrode AC is disposed between the gate driving integrated circuit GIP and display area AA, in convenience, but it can be disposed over the thin film transistor area TA. For example, for the case of the top emission type, the lights generated from the organic light emission layer OL radiates toward the cathode electrode CAT, so that the auxiliary cathode electrode AC may be formed as having a wide strip shape as being overlapped with but not contact the anode electrode ANO thereunder. For the bottom emission type, the auxiliary cathode electrode AC may be disposed at the thin film transistor area TA as being parallel with the gate line GL and not overlapped with the emission area.

In the interim, the ground line Vss can be disposed as overlapping with the gate driving integrated circuit GIP on the passivation layer PAS. According to the second embodiment, the width area of the non-display area NA can be narrowed than the width of the non-display area NA explained in the first embodiment. The cut-out portions shown with the dotted line in the FIG. 5 means the narrowed (or 'removed') bezel area as comparing with the first embodiment.

As the auxiliary cathode electrode AC is disposed on the planar layer PL, a contact hole for exposing the ground line Vss can be further formed when forming the planar layer PL. Otherwise, the planar layer PL can be patterned to expose the ground line Vss.

With the anode electrode ANO and the auxiliary cathode electrode AC, a bank BA is formed. By exposing the emission area in the anode electrode ANO, the bank BA can be formed. On the substrate SUB having the bank BA, an organic light emission layer OL and a cathode electrode CAT are deposited sequentially, so that the organic light emitting diode OLE is completed.

Referring to FIG. 6, we will explain about the cross-sectional structure of the organic light emitting diode display according to the second embodiment of the present disclosure, in detail. Here, in convenience, the thin film transistor has the bottom gate structure. However, the main feature of the second embodiment can be applied to the top gate structure also.

On the substrate SUB, a non-display area NA and a display area AA are defined. The non-display area NA includes the gate driving integrated circuit GIP and the ground line Vss are disposed. The display area AA includes a switching thin film transistor ST, a driving thin film transistor DT and an organic light emitting diode OLED are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS is deposited. On the passivation layer PAS, a ground line Vss is formed as overlapping with the gate driving integrated circuit GIP. On the substrate SUB having the ground line Vss, a planar layer PL is deposited. At the planar layer PL, a pixel contact hole PH for exposing the drain electrode DD of the driving thin film transistor DT. Further, the planar layer PL should be formed as exposing the ground line Vss. In some cases, contact holes for exposing the ground line Vss may be formed at the planar layer PL.

On the planar layer PL, an anode electrode ANO having an isolation shape within the pixel area PA is formed. The anode electrode ANO connects to the drain electrode DD of the driving thin film transistor DT through the contact hole penetrating the passivation layer PAS and the planar layer PL. Further, on the planar layer PL, the auxiliary cathode electrode AC is formed as having the same material with the anode electrode ANO but being separated from the anode electrode ANO with a predetermined distance. Especially, the auxiliary cathode electrode AC is directly contacted the ground line Vss exposed by the planar layer PL.

On the substrate SUB having the anode electrode ANO, a bank BA is deposited for defining the emission area. By patterning the bank BA, the most center portions of the anode electrode ANO are exposed. On the exposed anode electrode ANO, an organic light emission layer OL is deposited. It is preferable that the organic light emission layer OL is not covering the auxiliary cathode electrode AC and the ground line Vss in the display area AA. When the organic light emission layer OL may be disposed on some portions of the non-display area NA, at least, major portions of the ground line Vss should not be covered by the organic light emission layer OL.

Depositing a transparent conductive material on the substrate SUB having the organic light emission layer OL, the cathode electrode CAT is formed. Then, the organic light emitting diode OLED including the anode electrode ANO, the organic light emission layer OL and the cathode electrode CAT is formed. Here, it is preferable that the cathode electrode CAT covers the non-display area NA. Further, the cathode electrode CAT can directly contact the auxiliary cathode electrode AC and/or the ground line Vss. As the result, the ground (or, reference) voltage can be supplied to the cathode electrode CAT via the ground line Vss.

In the second embodiment, the auxiliary cathode electrode AC is included and it contacts and/or connects the ground line Vss and/or the cathode electrode CAT so that the surface resistance of the cathode electrode CAT can be lowered. Further, the ground line Vss can be disposed as overlapping with the gate driving integrated circuit GIP so that the narrow bezel in which the width of the non-display area NA is minimized can be acquired.

Further, the ground line Vss is stacked over the gate driving integrated circuit GIP. The gate driving integrated circuit GIP has the relatively wider width than other elements of the display. By forming the ground line Vss as covering the whole area of the gate driving integrated circuit GIP, the ground line Vss has large area corresponding to the gate driving integrated circuit GIP. In the first embodiment, the width of the ground line Vss is one factor for deciding the width of the bezel, so that it is very restricted to design the narrow bezel structure due to the width of the ground line Vss. As the gate driving integrated circuit GIP has wider width than the ground line Vss, by overlapping the ground line Vss on the gate driving integrated circuit GIP, the narrow bezel structure can be acquired.

Third Embodiment

Figure 7A:
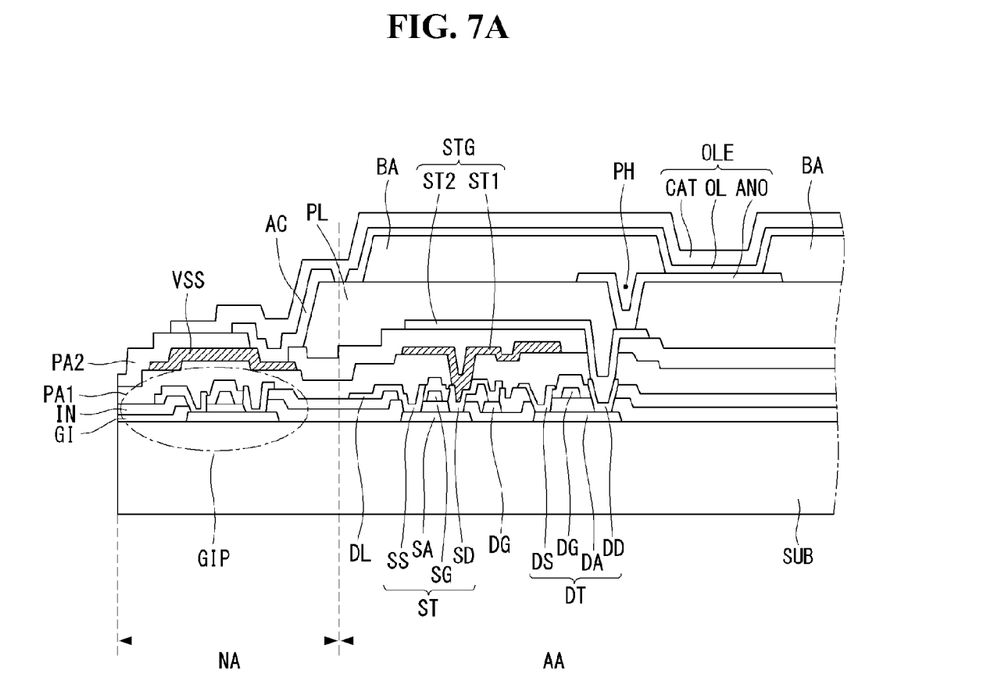
FIGS. 7A and 7B are cross sectional views illustrating a structure of the organic light emitting diode display according to a third example embodiment of the present disclosure.
Figure 7B:
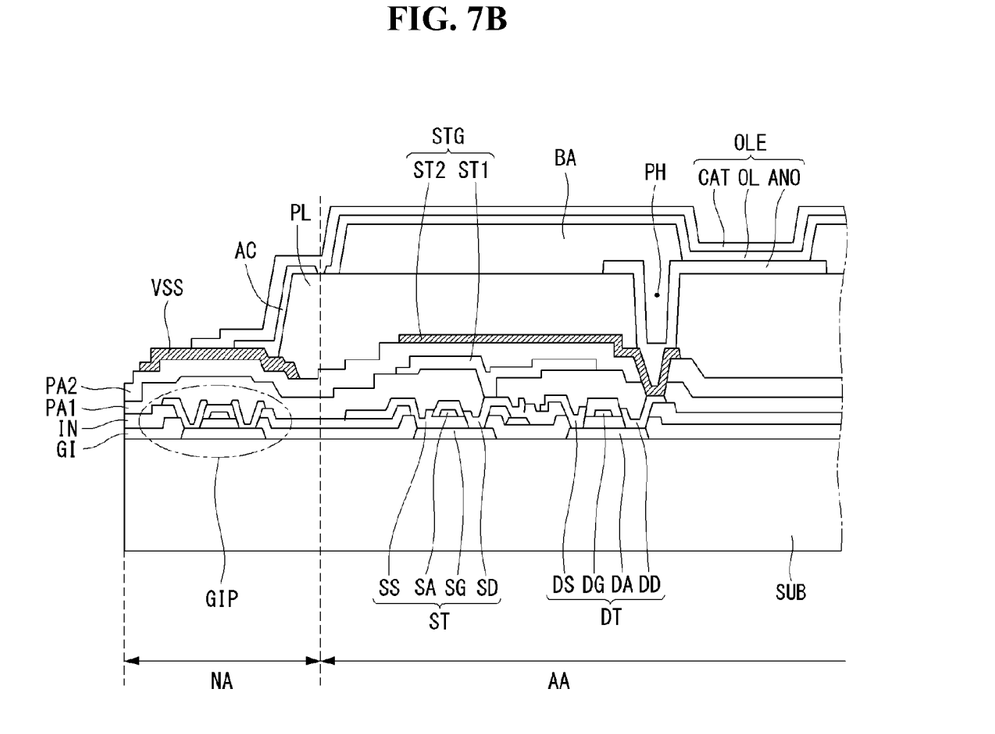

In the second embodiment, we explained about a simplized structure in which the ground line Vss is overlapping with the gate driving integrated circuit GIP. For the real organic light emitting diode display, the ground line Vss is formed separately, so that the manufacturing processes may be complicated. By forming an electrode layer used for one element, the main feature of the present disclosure can be acquired without increasing of the step number of the manufacturing processes. In the third embodiment, we will explain about the organic light emitting diode display in which the storage capacitance is overlapped with the thin film transistor for ensuring large aperture ratio like the top capacitance structure. In that structure, the ground line Vss is made of the metal layer for the storage capacitance. FIGS. 7A and 7B are cross sectional views illustrating a structure of the organic light emitting diode display, according to the third embodiment of the present disclosure. Here, we will focus on the structure of the ground line Vss and the narrow bezel structure is very similar with that of the second embodiment.

At first, referring to FIG. 7A, we will explain about that ground line Vss is formed by using the metal layer for the first electrode of the top storage capacitance. On the substrate SUB, a switching thin film transistor ST and a driving thin film transistor DT are formed in the display area AA. In the non-display area NA, a thin film transistor for the gate driving integrated circuit GIP is formed.

On the whole surface of the substrate SUB having the thin film transistors ST and DT and the gate driving integrated circuit GIP, a first passivation layer PA1 is deposited. On the first passivation layer PA1, a first electrode of the storage capacitance ST1 is formed as overlapping with the thin film transistors ST and DT. The first electrode of the storage capacitance ST1 may be connected to the drain electrode SD of the switching thin film transistor ST. In the interim, on the same layer with the first electrode of the storage capacitance ST1, using the same material of the first electrode of the storage capacitance ST1, a ground line Vss is formed. Especially, the ground line Vss is overlapped with the gate driving integrated circuit GIP.

On the substrate SUB having the ground line Vss and the first electrode of the storage capacitance ST1, a second passivation layer PA2 is deposited. On the second passivation layer PA2, a second electrode of the storage capacitance ST2 is formed as overlapping with the first electrode of the storage capacitance ST1. The second electrode of the storage capacitance ST2 may be connected to the drain electrode DD of the driving thin film transistor DT. The storage capacitance STG may be formed where the first electrode ST1 and the second electrode ST2 are overlapped each other with the second passivation layer PA2 therebetween.

The second passivation layer PA2 may be patterned as not covering the non-display area NA. That is, the second passivation layer PA2 may be patterned as exposing a lot of portions of the ground line Vss. Otherwise, even though it is not shown in drawings, the second passivation layer PA2 may be deposited as covering the whole surface of the substrate SUB and may have a contact hole exposing a lot of portions of the ground line Vss.

On the substrate SUB having the second electrode of the storage capacitance ST2, a planar layer PL is deposited. Here, it is preferable that the planar layer PL is deposited as not covering the ground line Vss disposed over the gate driving integrated circuit GIP. Otherwise, by patterning the planar layer PL, the contact hole for exposing the ground line Vss may be formed when forming the pixel contact hole PH exposing the drain electrode DD of the driving thin film transistor DT or the second electrode of the storage capacitance ST2.

On the planar layer PL, an anode electrode ANO is formed. In addition, an auxiliary cathode electrode AC is formed on the same layer and by the same material with the anode electrode ANO, but the auxiliary cathode electrode AC is separated from the anode electrode ANO, physically and electrically. Especially, the auxiliary cathode electrode AC may have a larger area as possible on the substrate SUB, and it is preferably contacted the ground line Vss.

With the anode electrode ANO and the auxiliary cathode electrode AC, a bank BA is formed. The bank BA includes an aperture portion exposing the emission area of the anode electrode ANO. Further, the bank BA is not covering the non-display area NA so that it preferably exposes some portions of the auxiliary cathode electrode AC and the ground line Vss.

On the bank BA, an organic light emission layer OL is disposed. It is preferable that the organic light emission layer OL is disposed within the display area AA excepting the non-display area NA. That is, the organic light emission layer OL is not covering the auxiliary cathode electrode AC and the ground line Vss. On the organic light emission layer OL, a cathode electrode CAT is deposited. At the aperture portions of the bank BA in the display area AA, by stacking the anode electrode ANO, the organic light emission layer OL and the cathode electrode CAT, the organic light emitting diode OLE is completed. In addition, the cathode electrode CAT is preferably covering the non-display area NA. Here, it is preferable that the cathode electrode CAT covers the non-display area NA. Further, the cathode electrode CAT can directly contact the auxiliary cathode electrode AC and/or the ground line Vss. As the result, the ground (or, reference) voltage can be supplied to the cathode electrode CAT via the ground line Vss.

Next, referring to FIG. 7B, we will explain about that the ground line Vss is made of the metal material for the second electrode for the top storage capacitance. On the substrate SUB, a switching thin film transistor ST and a driving thin film transistor DT are formed in the display area AA. In the non-display area NA, a thin film transistor for the gate driving integrated circuit GIP is formed.

On the whole surface of the substrate SUB having the thin film transistors ST and DT and the gate driving integrated circuit GIP, a first passivation layer PA1 is deposited. On the first passivation layer PA1, a first electrode of the storage capacitance ST1 is formed as overlapping with the thin film transistors ST and DT. The first electrode of the storage capacitance ST1 may be connected to the drain electrode SD of the switching thin film transistor ST.

On the substrate SUB having the first electrode of the storage capacitance ST1, a second passivation layer PA2 is deposited. On the second passivation layer PA2, a second electrode of the storage capacitance ST2 is formed as overlapping with the first electrode of the storage capacitance ST1. The second electrode of the storage capacitance ST2 may be connected to the drain electrode DD of the driving thin film transistor DT. The storage capacitance STG may be formed where the first electrode ST1 and the second electrode ST2 are overlapped each other with the second passivation layer PA2 therebetween. In the interim, on the same layer with the second electrode of the storage capacitance ST2, using the same material of the second electrode of the storage capacitance ST2, a ground line Vss is formed. Especially, the ground line Vss is overlapped with the gate driving integrated circuit GIP.

On the substrate SUB having the ground line Vss and the first electrode of the storage capacitance ST1, a planar layer PL is deposited. Here, it is preferable that the planar layer PL is deposited as not covering the ground line Vss disposed over the gate driving integrated circuit GIP. Otherwise, by patterning the planar layer PL, the contact hole for exposing the ground line Vss may be formed when forming the pixel contact hole PH exposing the drain electrode DD of the driving thin film transistor DT or the second electrode of the storage capacitance ST2.

On the planar layer PL, an anode electrode ANO is formed. In addition, an auxiliary cathode electrode AC is formed on the same layer and by the same material with the anode electrode ANO, but the auxiliary cathode electrode AC is separated from the anode electrode ANO, physically and electrically. Especially, the auxiliary cathode electrode AC may have a larger area as possible on the substrate SUB, and it is preferably contacted the ground line Vss.

With the anode electrode ANO and the auxiliary cathode electrode AC, a bank BA is formed. The bank BA includes an aperture portion exposing the emission area of the anode electrode ANO. Further, the bank BA is not covering the non-display area NA so that it preferably exposes some portions of the auxiliary cathode electrode AC and the ground line Vss.

On the bank BA, an organic light emission layer OL is disposed. It is preferable that the organic light emission layer OL is disposed within the display area AA excepting the non-display area NA. That is, the organic light emission layer OL is not covering the auxiliary cathode electrode AC and the ground line Vss. On the organic light emission layer OL, a cathode electrode CAT is deposited. At the aperture portions of the bank BA in the display area AA, by stacking the anode electrode ANO, the organic light emission layer OL and the cathode electrode CAT, the organic light emitting diode OLE is completed. In addition, the cathode electrode CAT is preferably covering the non-display area NA. Here, it is preferable that the cathode electrode CAT covers the non-display area NA. Further, the cathode electrode CAT can directly contact the auxiliary cathode electrode AC and/or the ground line Vss. As the result, the ground (or, reference) voltage can be supplied to the cathode electrode CAT via the ground line Vss.

The organic light emitting diode display device according to example embodiments of the present invention comprises an auxiliary cathode electrode formed with the anode electrode, for connecting to the cathode electrode. Therefore, the cathode electrode can have lower surface resistance enough to have uniformed brightness distribution over the whole surface of the large area organic light emitting diode display panel. Further forming the ground line using an intermediate metal layer as overlapping with the gate driver elements disposed in the non-display area, the display may have the narrow bezel structure. The ground line disposed as surrounding the display area can be connected to the auxiliary cathode electrode and the cathode electrode directly for supplying the ground voltage, the reference (or 'ground') voltage can be supplied uniformly over the whole surface of the cathode electrode.

It will be apparent to those skilled in the art that various modifications and variations can be made in the organic light emitting diode display of the present invention without departing from the spirit or scope of the invention. Thus, it is intended that the present invention cover the modifications and variations of this invention provided they come within the scope of the appended claims and their equivalents.

What is claimed is:

1. An organic light emitting diode display, comprising:
   a substrate including a display area and a non-display area;
   a gate driver disposed in the non-display area;
   a ground line overlapping on the gate driver with a passivation layer;
   an anode electrode disposed in the display area;
   an organic light emission layer disposed in the display area and stacked on the anode electrode; and
   a cathode electrode stacked on the organic light emission layer and contacting the ground line.

2. The organic light emitting diode display according to the claim 1, further comprising:
   a thin film transistor disposed in the display area and contacting the anode electrode; and
   an auxiliary cathode electrode including the same material with the anode electrode, separated from the anode electrode, and contacting the ground line.

3. The organic light emitting diode display according to the claim 2, further comprising:
   a planar layer disposed on the ground line and the thin film transistor, and exposing some portions of the ground line and the thin film transistor,
   wherein the anode electrode and the auxiliary cathode electrode are disposed on the planar layer,
   wherein the auxiliary cathode electrode contacts the ground line exposed from the planar layer, and
   wherein the cathode electrode contacts the auxiliary cathode electrode and the ground line.

4. The organic light emitting diode display according to the claim 1, further comprising:
   a thin film transistor disposed in the display area and contacting the anode electrode;
   a first storage electrode overlapping with the thin film transistor on a first passivation layer; and
   a second storage electrode overlapping with the first storage electrode with a second passivation layer,
   wherein the ground line is disposed on a same layer and includes a same material with any one of the first storage electrode and the second storage electrode.

* * * * *